United States Patent
Shum et al.

(10) Patent No.: US 6,711,065 B2
(45) Date of Patent: Mar. 23, 2004

(54) 1 T FLASH MEMORY RECOVERY SCHEME FOR OVER-ERASURE

(75) Inventors: Danny Shum, Poughkeepsie, NY (US); George Tempel, Sterrebeek (DE); Christoph Ludwig, Langebrueck (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/109,270

(22) Filed: Mar. 28, 2002

(65) Prior Publication Data

US 2003/0185057 A1 Oct. 2, 2003

(51) Int. Cl.$^7$ ................................ G11C 7/00
(52) U.S. Cl. ................ 365/185.29; 365/185.3; 365/218
(58) Field of Search ............... 365/185.29, 185.3, 365/218, 185.01

(56) References Cited

U.S. PATENT DOCUMENTS

| | | | | |
|---|---|---|---|---|
| 5,838,618 A | * | 11/1998 | Lee et al. | 365/185.29 |
| 5,862,078 A | * | 1/1999 | Yeh et al. | 365/185.29 |
| 5,903,499 A | * | 5/1999 | Peng et al. | 365/185.29 |
| 5,949,717 A | * | 9/1999 | Ho et al. | 365/185.29 |
| 6,049,484 A | * | 4/2000 | Lee et al. | 365/185.29 |
| 6,055,183 A | * | 4/2000 | Ho et al. | 365/185.09 |
| 6,411,547 B2 | * | 6/2002 | Choi | 365/185.14 |
| 6,525,970 B2 | * | 2/2003 | Wang et al. | 365/185.29 |

OTHER PUBLICATIONS

Kynett, Virgil Niles, et al, "A90–ns One–Million Erase/Program Cycle 1–Mbit Flash Memory", *IEEE Journal of Solid–State Circuits*, vol. 24, No. 5, pp. 1259–1264, (Oct. 1989).

Yamada, Seiji, et al., "A Self–Convergence Erasing Scheme For a Simple Stacked Gate Flash EEPROM", *IEEE*, vol. 91, pp. 307–310, (1991).

Yoshikawa, Kuniyoshi, et al., "Comparison of Current Flash EEPROM Erasing Methods: Stability and How to Control", *IEEE*, vol. 92, pp. 595–598 (1992).

* cited by examiner

Primary Examiner—Viet Q. Nguyen
(74) Attorney, Agent, or Firm—Thomas R. FitzGerald, Esq.

(57) ABSTRACT

Flash EEPROM cells are erased and recovered to a common threshold voltage by a two step process. First, the cells are erased. Second, the fixed (control) gates are set at a voltage of the same polarity as the programming voltage and at a magnitude of about half the programming voltage. The source is allowed to float and the drain (bitline) and body are set at a low level and at a polarity opposite to the programming voltage polarity.

12 Claims, 2 Drawing Sheets

1T FLASH MEMORY RECOVERY SCHEME FOR OVER-ERASURE

BACKGROUND OF THE INVENTION

The threshold voltage of flash memory cells often changes when the cell is electrically erased. Flash memory cells have floating gates that selectively store charge to program the cell on or off ("1" or "0"). Erasing charge on a floating gate can continue beyond a neutral level to place a net positive charge on the floating gate. That results in a low threshold voltage, or in extreme cases, a net negative threshold voltage. A low or negative threshold voltage can electrically short out a bitline of memory or increase leakage current of the same bitline. That will cause false readings of logic "1s" ones from the column during a read operation even if the selected cell is in a logic "0" state. Over-erased cells with low threshold draw high current. That is a problem for low power, portable electronic devices, such as personal digital assistants, cell phones and laptop computers. When their EEPEOM memories arrays are in a low power mode, the draw from over erased cells is large and causes false readings. In addition, the threshold voltage of the cell may change after electrical erasure due to coupling ratio and tunneling probability yielding a much wider threshold voltage distribution.

Conventional flash memories have addressed this problem using several techniques. For instance, see the verified-erase method of V. N. Kyunett et al., "A 90-ns One-Million Erase/Program Cycle 1-Mbit Flash Memory," IEEE J. Solid-State Circuits, vol. SC-24, no. 10, pp. 1238–1243, 1989. It pre-programs cells and provides a complicated erase algorithm when repeated cell programming results in leaky cells. However, the distribution of threshold voltages of all cells in a memory is usually Gaussian and ranges typically from 4 volts down to 0 volts. Such devices rely upon reiterative erasure until a cell is erased to a desired discharge level. Consequently, the time required to erase a bit vary greatly among the cells.

Reducing the spread of the distribution of threshold voltages (Vt) provides a more overall uniform erase threshold voltage. There are two step erase procedures that shrink the spread of the erased Vt distribution. With these two step procedures, flash EEPROM array is erased and its threshold voltage distribution of the erased flash EEPROM cells is converged to within a predetermined voltage range. In the first step, a conventional "edge" or "channel" electrical bulk erase procedure is accomplished by applying a high voltage to the source (edge erase) or the control gate (channel erase) of the cell. Erase occurs according to a Fowler-Nordheim tunneling mechanism that causes electrons to tunnel from the floating gate to the source (edge erase) or body (channel erase), resulting in cells with a relatively low threshold voltage. In the second step, the cell is programmed by applying a high voltage to the control gate (using Fowler-Nordheim tunneling) to converge the erased threshold voltage distribution of the array to within the predetermined voltage range. The drain, source and substrate of the 1T flash transistor are grounded or presented with no bias across those regions. This grounded or non-biasing approach allows chip-wise or block-wise memory recovery from over erasure, but no bitline-wise recovery. Another method is the self-convergence erasing scheme that typically uses channel hot carrier injection. (see S. Yamada et al., "A Self-Convergence Erasing Scheme for a Simple Stacked gate Flash EEPROM," IEEE IEDM Tech. Dig., pp. 307–310, 1991 and K. Yoshikawa et al., "Comparison of Current Flash EEPROM Erasing Methods: Stability and How to Control," IEEE IEDM Tech. Dig., p. 595, 1992). However, that method is undesirable due to its high current requirements.

SUMMARY

The invention provides a method for recovering a flash EEPROM cell from over-erasure. In particular it provides a method for recovering cells in an array to converge to a common threshold voltage so that there is no extra leakage due to "low $V_t$" cells and no erroneous sensing of data of other cells that share the same bit line during read operations. In its broader aspect, the invention is a method for erasing data stored as charge in programmable cells of an electrically erasable programmable device. The method is performed on an EEPROM cell that comprises a transistor including source, body and drain regions in a substrate with a channel extending between the source and drain region. The source and drain regions have a conductivity opposite the conductivity of the body and the channel. Above the channel is a floating gate and a control gate. The control gate is separated from a floating gate by a dielectric layer. The floating gate is separated from the channel by another dielectric layer. The floating gate stores an electrical charge representative of data.

The erase and recovery method includes a first step of placing a first voltage of one polarity and of a first magnitude level on the control gate of the transistor of the cell. The first voltage is sufficient to erase electrical charge stored in the EEPROM. During erasing, the source and drain regions of the transistor are allowed to float. After erasing, the cell is returned to a common threshold voltage by applying to the control gate a second voltage opposite in polarity to the first voltage and of a second magnitude. Then a third voltage of the first polarity and of a third magnitude, smaller than the second magnitude, is applied to the source and body regions of the transistor. As a result, the EEPROM recovers to near its original threshold voltage. When this method is used on all the cells in an array, each EEPROM cell in the array is returned to near the same threshold voltage.

N-channel devices are recovered by placing a strong positive voltage (about +6 volts) on the control gate, lowering the voltage on drain (bit line) and the body to about −3 volts and letting the source float. P-channel devices are recovered in the opposite manner. After erasure, a strong negative voltage (about −6 volts) is applied to the control gate, the voltage on the drain (bit line) and the body are raised to about +3 volts and the source is allowed to float. The currents required to recover the cells to their desired erased state are lower than the currents required by other methods. In addition, the array can be erased by cell, row or column depending upon the array structure.

DETAILED DESCRIPTION OF THE INVENTION

To illustrate the invention, the following description is made in connection with a triple well flash memory transistor. That transistor is shown and claimed in co-pending patent application U.S. Ser. No. 10/057039, filed, Jan. 25, 2002 whose entire disclosure is incorporated by reference. Those skilled in the art will understand that the inventive recovery method disclosed and claimed in this application can be practiced with either a triple well EEPROM transistor or with a dual well EEPROM transistor.

Figure 1:
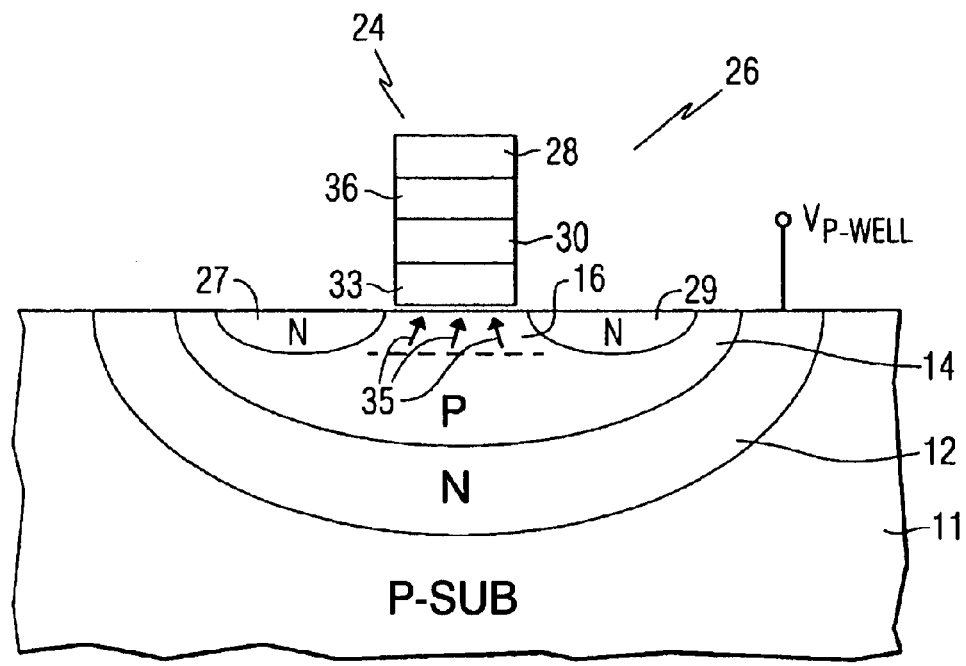
FIG. 1 is a partial cross-sectional view of a one-transistor flash memory cell according to the invention.

FIG. 1 illustrates a partial schematic/partial cross-sectional view of a one-transistor (1T) flash memory cell 26 according to the invention. The cell 26 may be constructed according to conventional or other fabrication methods combining triple well formation with double polysilicon technology. The triple-well cell 26 comprises a first p-well region 14, a second n-well region 12 and a third well or substrate region 11 (labeled here as p-sub). Cell 26 includes a floating gate transistor 24. It has source and drain regions 27, 29, a channel 16, and stacked gate including a floating gate 30/33 and a control gate 28/36. The conductivity type of the transistors (e.g., n-type or p-type) will change according to the type of field-effect transistor being fabricated for the cell. The foregoing conductivity types correspond to NMOS devices. Opposite conductivity types to those named would be used with PMOS devices. In contrast to hot injection devices, the drains and sources of the invention may be symmetrical in doping.

The floating gate includes a floating gate insulator 33 formed on the substrate 11. The insulator 33 is typically silicon dioxide, oxynitride, or silicon nitride. It is approximately 100 Å thick, but may be of any suitable thickness for tunneling operations. A floating gate electrode 30 is formed on the insulator 33. The electrode 30 is highly conductive and may be formed from heavily doped polysilicon or metal. The control gate has an inter-gate insulator 36 over the floating gate electrode 30 and a control gate electrode 28. The insulator 36 is typically oxynitride. The control gate electrode 28 may also be formed from heavily doped polysilicon or metal. Channel 16 lies beneath the floating gate 30 and between the source 27 and drain 29.

Programming

One of two methods can be used to program the cell 26. One method is channel hot electron (CHE) injection. It is commonly used in NOR array architectures. The other method is Fowler-Nordheim (FN) tunneling and can be used in both NOR array (edge programming) and AND array (channel programming) architectures.

CHE injection relies upon creating an avalanche of electrons beneath the floating gate. During programming, the control gate is biased to a high voltage to turn on the channel by creating an inversion layer beneath the gate. The source and substrate are held at ground. Next, the drain is biased to near Zener diode (pn junction) breakdown (about 0.5 volts below junction breakdown) to pinch off the channel. Electrons become "hot" (energetic) and accelerate toward the drain 26. Programming occur when the voltage on the floating gate Vfg exceeds 3.2V (Si/SiO2 energy barrier). Electrons are injected at the pinch-off region toward the floating gate by momentum transfer. In a typical hot electron programming operation the control gate 28 is biased of about +12 volts and the drain 29 is biased to about 6.5 volts.

Channel Fowler-Nordheim (FN) tunneling uses a mechanism of uniform channel programming. It biases the gate voltage $V_G$ positive so that the channel 16 is on. A typical gate bias of +12 volts creates an inversion layer that connects the source to the drain. The voltage ($V_D$) on the drain 29 is toggled low (typically −3V) and is applied to the drain end 29 of the channel. The p-well is also biased to the same $V_D$ (−3V) to prevent the source/drain junction from forward biasing due to −3V (NMOS construction). The source 27 is allowed to float. Since the channel 16 is on, the drain voltage is passed to the floating source and the entire channel is at a common voltage of, for example, about −3 volts. As such, the voltage over the channel is the gate voltage (+12/13 volts) less the drain/source voltage (−3 volts) for a voltage difference of about 15/16 volts. That is enough voltage for electrons 35 to tunnel under the floating gate insulator 33. PMOS devices are programmed in a similar way, with a corresponding reversal in the polarities of the applied voltages. In a PMOS device the gate is biased negative and the drain has a small positive voltage. The voltage difference across the channel is again about 15 to 16 volts. That voltage difference is sufficient to generate tunnel holes through the gate oxide interface. The holes are stored in the floating gate.

Figure 2:
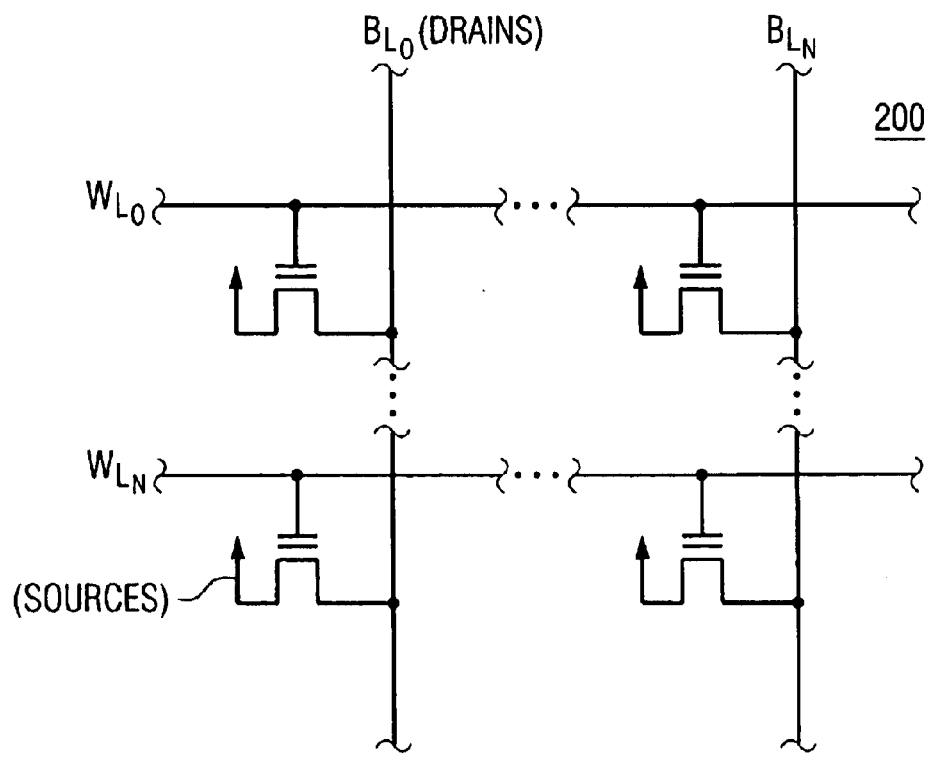
FIG. 2 is a partial schematic of a one-transistor flash memory cell NOR array according to the invention.

FIG. 2 shows partial schematics a one-transistor cell NOR array 200 that has a 1T cell 26 in each cell. The drains of each floating gate transistor 24 in a column are connected together by a common bit line such as BL0, BL1, . . . BLn. The control gates 28 of each floating gate transistor 24 in each row are connected together by a common word line. The array 200 has word lines WL0, WL1 . . . WLn. The sources of each floating gate 24 in each row and each column are connected together.

Figure 3:
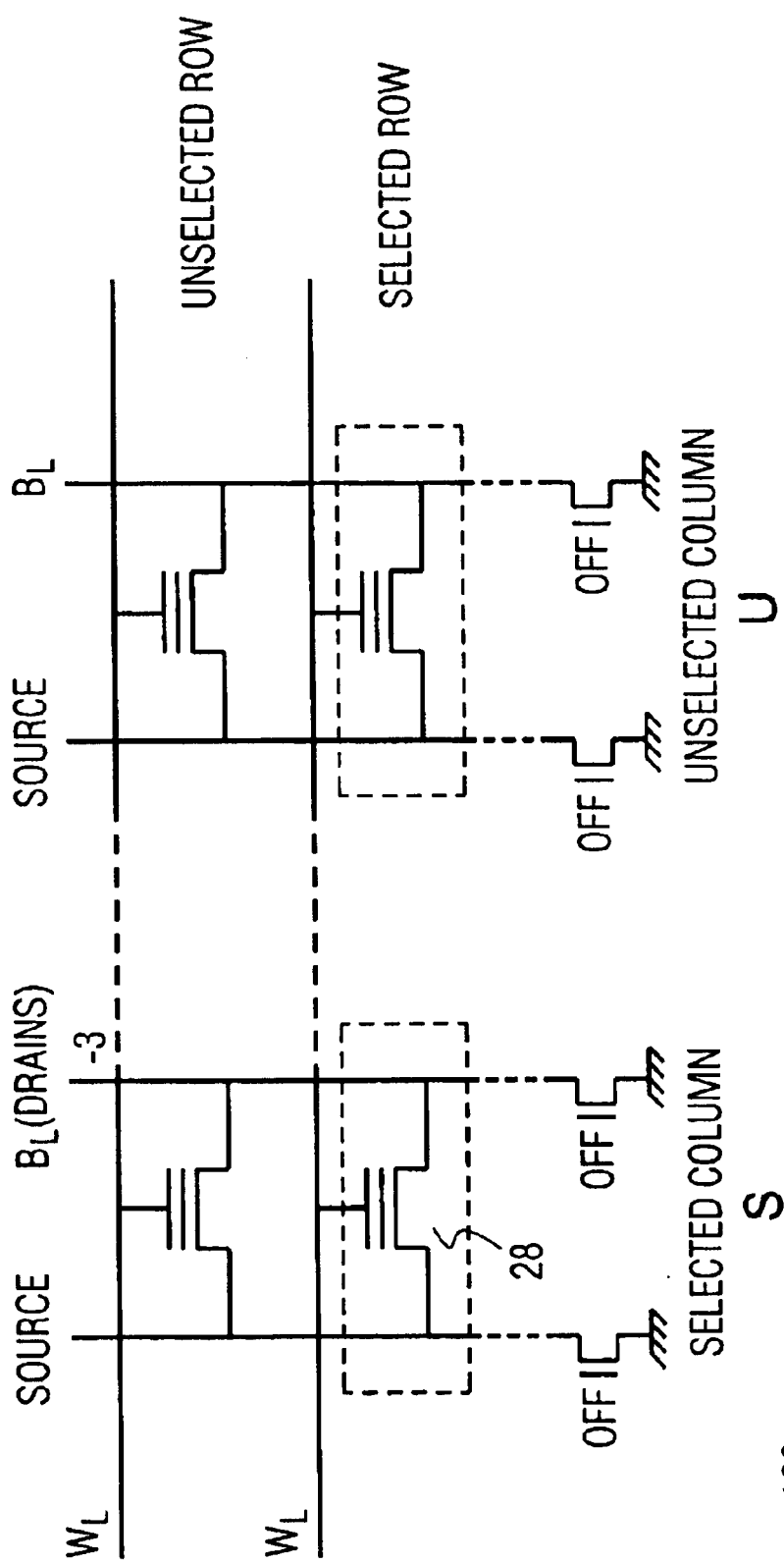
FIG. 3 is a partial schematic of a one-transistor flash memory cell AND array according to the invention.

FIG. 3 shows partial schematics of a one-transistor cell AND array 100. To program a cell 26 in AND array 100, the associated bit line (BL) is toggled low (typically −3 volts) while the associated word line (WL) is toggled strongly high, about +12 volts. The p-well is also biased to the same BL voltage (−3V) to prevent the source/drain junction from forward biasing due to −3V (NMOS construction). An appropriate voltage on the bit line and the word line of a cell selects the cell.

Unselected cells sharing the same word line as the selected cell could be subject to a phenomenon known as gate disturb, where the unselected cell could be unintentionally programmed. However, by applying a full voltage swing of opposite polarity between the selected bit line and unselected bit line, a disturb event is less likely to occur. A typical strong high voltage for the selected word line, such as WLO, for device 26 is around 12 to 13 volts. The control gate of the floating gate transistor 24 is pulsed to set the threshold of the transistor 24 at one of a number of different levels. The bit lines of unselected columns, such as BL1, BL2 . . . , remain at a high level, e.g., around 3 to 4 volts. Thus the gate disturb on the unselected cells sharing the same word lines reduce to a net gate voltage of ~9V (12/13V−3/4V) over the channel. That voltage is near to the minimum voltage needed for tunneling, greatly reduce any gate disturb. The word lines of unselected rows are grounded or slightly negative. The bias of the p-well region 14 is held at a low voltage (e.g. −3 volts) while the source voltage in the 1T cell is left floating.

Unselected cells which are associated with the bit line of a selected cell, such as BL0 are subject to a phenomenon known as drain disturb wherein one of these unselected cells may be unintentionally programmed. To prevent such an error, the unselected wordline is bias to zero or −3V. Since a strong program voltage (i.e. 12 volts) generally required for programming device 40, this high program voltage makes occurrence of drain disturb less likely.

In connection with programming, a depletion mode transistor is turned off (programmed off or made to store a logic low level voltage) by carriers that (with reference to FIG. 1) tunnel in the direction of arrows 35 through a Fowler-Nordheim mechanism to floating gate 24. For device 24, the carriers are electrons. Note that tunneling through gate oxide 33 occurs from the channel region to the floating gate 30, rather than from a drain or source region to the floating gate. This particular tunnel mechanism helps prevent the destruction of the tunnel oxide as discussed in the foregoing section concerning prior art devices. The negative voltage (−3 volts) on the p-well 14 provides that well with a large supply of minority charge carriers (electrons). When a positive voltage is applied to the control gate electrode 28, the minority charge carriers in the p-well 14 are attracted toward the floating gate 30 that lies over the channel 16. As the voltage on the control electrode 28 increases, the electrons in the channel 16 tunnel through the oxide 33 and are captured by the floating gate 24. The foregoing voltage characterizations apply to n-channel transistors. Opposite voltage levels (e.g. low instead of high, etc.) apply to p-channel transistors.

Erasing

With reference to the 1T arrays 200 (NOR) and 100 (AND), one may erase the entire array or block erase one row at a time with conventional edge or channel erase. Channel case: In order to erase a row, the word line for a give row is held highly negative (−12 to −14 volts). All the bit lines associated with the given row are connected to a low positive voltage, about +3 volts, such as $V_D$, the drain bias voltage. The common source region is left floating or set to a positive voltage to maintain the uniform channel potential. The potential of p-well 14, $V_{P-well}$, is maintained at a high level (e.g. 3 volts). Control gates of unselected rows are toggled low (0 to +3 volts). The gate disturb phenomenon could erase unselected cells. However, due the relatively strong negative voltage (e.g. −12 volts) used to erase a cell, this is less likely.

Recovery

The recovery from over-erasure scheme according to the invention can erase a column of memory. The first step brings the control gate 28 of each cell in a column to a strong negative high logic level, e.g. −12 volts, while the body and bitline (connected to the drain of the transistor) are bias to +3V. The source region 27 is left floating. Then the cell is erased using FN techniques. To compensate for over-erasure and to recover the erased correct state for a transistor, control gates 28 are brought to a strong positive logic level, e.g. +6 volts while the drains (bitline) 29 and body regions 14 are brought to a low level, e.g. −3 volts. The source regions 27 are allowed to float.

FIG. 3 illustrates a schematic drawings of two columns of EEPROM flash memory cells from an AND array of memory cells. A column S of selective memory cells is erased and recovered from over-erasure by the two step process described in the paragraph above. The process is performed on the memory cells in the selected column. Unselected columns U are biased according to the bias of a selected cell except that the bitline is raised in voltage. For instance, with reference to FIG. 3 which shows a schematic drawings of a memory cell from an unselected column, control gates 28 are brought high, e.g. +6 volts, body regions 114 are at −3 volts, the source regions 27 are left floating and drains (bitline) 29 are grounded (0 volts).

The flash memory recovery scheme can be applied chip-wise to all cells of the memory. In this instance, all cells are erased according to the afore-described first step and all cells are biased according to the bias of a selected column as shown in FIG. 3.

The flash memory recovery scheme can be applied to FIG. 2 of a NOR array of memory cells. In this instance, all cells are erased according to the afore-described first step and all cells are biased according to the bias of a selected rows as shown in Table 7.

The two step-recovery scheme of the invention uses a uniform electric potential across the tunnel oxide. The method allows low power with no gate-to-dielectric leakage current, bulk mode and ensures a stable voltage threshold shift over time. The foregoing description is easily applied to p-channel devices by a change in polarity with floating nodes kept floating.

The invention can be implemented as an integrated circuit according to well known semiconductor fabrication methods. Although the invention has been described in detail herein with reference to preferred embodiments and certain described alternatives, it is to be understood that this description is by way of example only, and it is not to be construed in a limiting sense. For instance p-channel EEPROMs according to the invention will be programmed with reverse polarities to those discussed, with supply voltage levels being substituted for ground. It is to be further understood that numerous changes in the details of the embodiments of the invention and additional embodiments of the invention, will be apparent to, and may be made by persons of ordinary skill in the art having reference to this description. It is contemplated that all such changes and additional embodiments are within the spirit and true scope of the invention as claimed below.

Reading

With reference to FIGS. 2 or 3, in order to read the contents of a selected 1T memory cell 26 the control gate is toggled high (e.g., the circuit supply voltage) along with the associated bit line (e.g. 1.5 volts) of selected cell 26. Likewise voltage $V_{P-well}$, the p-well 14 voltage, is biased low (at circuit ground.). $V_S$ is also maintained low (i.e., circuit ground). Unselected bit lines along the selected word line are biased low (e.g., circuit ground) to avoid gate disturb. Bit line disturb could occur along cells associated with the same bit line. Additionally gate disturb could occur along cells associated with cells having the same selection gate line as the selected cell. The use of the circuit supply voltage in the former case involving gate disturb and the low voltages used involving the latter case make these situations unlikely. Charts 1–6 below summarize the foregoing cell scenarios for the 1T cell of FIG. 1. The given voltages are an example of such bias scheme, and will not limit the application of the disclosure mechanism.

TABLE 1

| PROGRAM | Bit line $BL_0$ (volts) | $V_s$ (volts) (source) | $V_p$ (well) (volts) | Control Gate (volts) (28) |
|---|---|---|---|---|
| Selected Cell | −3 | Floating | −3 | +12 to +13 |
| Non Selected Cell Columns | +3 to +4 | Floating | −3 | +12 to +13 |

TABLE 2

| PROGRAM (continued) | Bit line $BL_0$ (volts) | $V_s$ (volts) (source) | $V_p$ (well) (volts) | Control Gate (volts) (28) |
|---|---|---|---|---|
| Non Selected Cell Rows | −3 | Floating | −3 | 0 to −3 |

TABLE 3

| ERASE | Bit line $BL_0$ (volts) | $V_s$ (volts) (source) | $V_p$ (well) (volts) | Control Gate |
|---|---|---|---|---|
| Selected Cell | +3 | Floating | +3 | −12 to −14 |
| Non Selected Cells | +3 | Floating | +3 | 0 to +3 |

TABLE 4

| RECOVER (AND) | Bit line $BL_0$ (volts) | $V_s$ (volts) (source) | $V_p$ (well) (volts) | Control Gate (volts) (28) |
|---|---|---|---|---|
| Selected Cell | −3 | Float | −3 | +6 |
| Non Selected Cell (selected rows) | 0 (ground) | Float | −3 | +6 |
| Non Selected Cell (selected columns) | −3 | Float | −3 | 0 or −3 |

TABLE 5

| RECOVER (NOR) | All Bit line $BL_{0,1...}$ (volts) | $V_s$ (volts) (source) | $V_p$ (well) (volts) | Control Gate (volts) (28) |
|---|---|---|---|---|
| Selected rows | −3 | Float | −3 | +6 |
| Non Selected rows | −3 | Float | −3 | 0 or −3 |

TABLE 6

| READ | Bit line (volts) | V(source) (volts) | $V_p$ (well) (volts) | Control Gate (volts) |
|---|---|---|---|---|
| Selected Cell | +1.5 | 0 | 0 | +Vdd |
| Non Selected Cell (selected rows) | 0 | 0 | 0 | +Vdd |
| Non Selected Cell (selected rows) | +1.5 | 0 | 0 | 0 |

TABLE 7

| RECOVER | Bit line (volts) | $V_s$ (source) (volts) | $V_p$ (well) (volts) | Control Gate (volts) |
|---|---|---|---|---|
| Selected Cell | −3 | FLOAT | −3 | +6 |
| Non Selected Cell (unselected rows) | −3 | FLOAT | −3 | 0 to −3 |

Benefits of the Triple Well

Triple well structures commonly experience 70% cell coupling. With that level of coupling and programming with 12 to 13 volts on the control gate and −3 volts on the p-well ($V_p$=−3 volts), the result is approximately 11–12 volts across a 100 Å tunnel oxide 33. In conventional, non-triple well devices, a structure with 12 volts on the control gate but without the negatively biased substrate (e.g., a substrate voltage of 0 volts at region 33) would only develop 8.4 volts across tunnel oxide 33 of FIG. 1. It is well known that electron tunneling is an extremely sensitive function of the capacitor cathode electric field. Electron tunneling requires a cathode electric field, $E_k=V_{tx}/T_{tx}$, of at least $10^7$ V/cm (where $T_{tx}$ is the tunnel dielectric thickness and $V_{tx}$ is the voltage dropped across this dielectric thickness, e.g. tunnel oxide 33). Eleven volts across 100 Å tunnel oxide 33 of transistor 50 provides an $E_k=1.1*10^7$ V/cm. By contrast, 8.4 volts across the tunnel oxide for a non-triple well structure in the example above, provides an $E_k=0.84*10^7$ V/cm. Another advantage of the invention is that $E_k$ is sufficient to cause tunneling without requiring a higher Vpp charge pump.

Another benefit of the triple well structure is that it allows scaling of the memory cell. Decreases in the size of the cell can include an attendant decrease in bias voltages, independent of the supply voltage. Structures without a triple well are penalized because their scaling is limited by the supply voltage since some minimum supply voltage will be required for proper functioning of peripheral circuitry, e.g. sense amps, etc. The foregoing triple well benefits are in addition to the beneficial effects of the tunnel mechanism, which prevents destruction of the tunnel oxide as previously, mentioned.

A further benefit is that uniform channel programming across the tunnel oxide of the channel region results in uniform tunneling of electron to the floating gate. This has the beneficial result of keeping the distribution of Vt narrow over the entire array for different threshold voltages. The distribution is tighter compared to conventional programming techniques. For example, the threshold voltage for any given target threshold varies as little as 100 mv in a 4M array over 100,000 programming cycles. This tight array Vt distribution is the key requirement for MLC devices that allow two or more states in a given cell.

When the above concept of programming is applied to a multi-level cell (MLC), a high-density memory array can be achieved using the same generation of technology. Conventional methods to achieve MLC rely primarily on injection programming such as hot electron injection or source-side hot-electron programming. However, this method of programming is not suitable for low power portable applications, e.g. cell phones, etc. Conventional low power methods of tunneling result in wide threshold voltage ($V_G$) distribution and threshold voltage shifts over time due to hole trapping. This can result in a large internal read voltage to compensate for the wide Vt window which in turn may cause data retention problems. Neither is suitable for MLC applications that require tight Vt distribution. The programming method according to the invention uses a uniform electric potential across the tunnel oxide.

With reference to FIG. 1, this electric potential extends between the p-well and the control gate 28. A constant field on the memory array is achieved by this method of programming. The use of a constant field across the whole channel results in key advantages, such as a tight Vt distribution and very stable Vt shift over program/erase cycling. For instance, experimental results indicate a shift of only about 100 mV in Vt after 100 k program/erase cycles. This programming method also allows a multi-level cell with more than two bits per cell.

Although the invention has been described in detail herein with reference to preferred embodiments and certain described alternatives, it is to be understood that this description is by way of example only, and it is not to be construed in a limiting sense. It is to be further understood that numerous changes in the details of the embodiments of the invention and additional embodiments of the invention, will be apparent to, and may be made by, persons of ordinary skill in the art having reference to this description. It is contemplated that all such changes and additional embodiments are within the spirit and true scope of the invention as claimed below.

We claim:

1. A method for erasing data stored as charge in programmable cells of an electrically erasable programmable device comprising an array of programmable cells in a semiconductor substrate, each programmable cell having a transistor including a body region in the substrate, a fixed gate separated from a floating gate by a dielectric layer, the fixed and floating gates arranged over a channel in the body region of the substrate, source and drain regions at opposite ends of the channel, the source and drain regions having a conductivity opposite the conductivity of the body and the channel, said method comprising:

placing a first voltage of one polarity and of a first magnitude level on the fixed gate of the transistor of the cell, the first magnitude of the first voltage sufficient to erase electrical charge stored in the dielectric layer;

floating the source and drain regions of the transistor;

applying a second voltage of an opposite polarity and of a second magnitude to the fixed gate;

applying a third voltage of the one polarity and of a third magnitude smaller than the second magnitude to the source and body regions of the transistor to return the charge stored in the dielectric layer to an unprogrammed state.

2. A method for erasing data stored as charge in programmable cells of an electrically erasable programmable device comprising an array of programmable cells in a semiconductor substrate, each programmable cell having a N-channel transistor including a N-body region in the substrate, a fixed gate separated from a floating gate by a dielectric layer, the fixed and floating gates arranged over a N-channel in the body region of the substrate, P-source and P-drain regions at opposite ends of the channel, the P-source and P-drain regions having a conductivity opposite the conductivity of the N-body and the N-channel, said method comprising:

placing a first voltage of a large negative polarity on the fixed gate of the transistor of the cell, the first voltage sufficient to erase electrical charge stored in the dielectric layer;

floating the P-source and P-drain regions of the transistor;

applying a second voltage of a smaller positive polarity to the fixed gate;

applying a third voltage of a negative polarity and smaller in magnitude than the second voltage to the P-source and N-body regions of the transistor to return the charge stored in the dielectric layer to an unprogrammed state.

3. The method of claim 2 wherein the N-body, the P-source and the P-drain are kept at a low positive voltage while the first voltage of a large negative polarity is applied to the fixed gate.

4. The method of claim 2 wherein unselected cells have their sources floating when the selected cells have their sources set to the third voltage.

5. The method of claim 2 wherein the first voltage is about −12 volts, the second voltage is about +6 volts and the third voltage is about −3 volts.

6. The method of claim 5 wherein the N-body, the P-source and the P-drain are kept at about +3 volts while the −12 volts are applied to the fixed gate.

7. The method of claim 2 wherein unselected cells have their sources floating when the selected cells have their sources set to the third voltage.

8. A method for erasing data stored as charge in programmable cells of an electrically erasable programmable device comprising an array of programmable cells in a semiconductor substrate, each programmable cell having a P-channel transistor including a P-body region in the substrate, a fixed gate separated from a floating gate by a dielectric layer, the fixed and floating gates arranged over a P-channel in the body region of the substrate, N-source and N-drain regions at opposite ends of the channel, the N-source and N-drain regions having a conductivity opposite the conductivity of the P-body and the P-channel, said method comprising:

placing a first voltage of a large positive polarity on the fixed gate of the transistor of the cell, the first voltage sufficient to erase electrical charge stored in the dielectric layer;

floating the N-source and N-drain regions of the transistor;

applying a second voltage of a smaller negative polarity to the fixed gate;

applying a third voltage of a positive polarity and smaller in magnitude than the second voltage to the N-source and P-body regions of the transistor to return the charge stored in the dielectric layer to an unprogrammed state.

9. The method of claim 8 wherein the P-body, the N-source and the N-drain are kept at a low negative voltage while the first voltage of a large positive polarity is applied to the fixed gate.

10. The method of claim 8 wherein unselected cells have their sources floating when the selected cells have their sources set to the third voltage.

11. The method of claim 8 wherein the first voltage is about +12 volts, the second voltage is about −6 volts and the third voltage is about +3 volts.

12. The method of claim 11 wherein the P-body, the N-source and the N-drain are kept at about −3 volts while the +12 volts are applied to the fixed gate.

* * * * *

UNITED STATES PATENT AND TRADEMARK OFFICE
CERTIFICATE OF CORRECTION

| | |
|---|---|
| PATENT NO. | : 6,711,065 B2 |
| APPLICATION NO. | : 10/109270 |
| DATED | : March 23, 2004 |
| INVENTOR(S) | : Danny Shum, Georg Tempel and Christoph Ludwig |

It is certified that error appears in the above-identified patent and that said Letters Patent is hereby corrected as shown below:

On title page ITEM (30) please add:
The claims to priority of the United States patent application Serial Number s (60/179,234 filed July 31, 2000, 09/771,808 filed January 29, 2001 and 09/410,119 filed September 30, 1999 )have been omitted from the bibliographic data on the above-referenced issued patent. Please add the claims to priority to the issued patent.

Since this error was not on the part of the Applicant, no fee has been enclosed.

Signed and Sealed this

Twenty-sixth Day of December, 2006

JON W. DUDAS
*Director of the United States Patent and Trademark Office*